United States Patent
Mittal et al.

(10) Patent No.: US 9,625,963 B2
(45) Date of Patent: Apr. 18, 2017

(54) THERMALLY-CONSTRAINED VOLTAGE AND FREQUENCY SCALING

(71) Applicant: QUALCOMM Incorporated, San Diego, CA (US)

(72) Inventors: Rajat Mittal, San Diego, CA (US); Mehdi Saeidi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/836,572

(22) Filed: Aug. 26, 2015

(65) Prior Publication Data

US 2016/0062422 A1   Mar. 3, 2016

Related U.S. Application Data

(60) Provisional application No. 62/043,716, filed on Aug. 29, 2014.

(51) Int. Cl.
  *G06F 1/32*    (2006.01)
  *G06F 1/20*    (2006.01)
  *H03K 19/00*   (2006.01)

(52) U.S. Cl.
  CPC .............. *G06F 1/206* (2013.01); *G06F 1/324* (2013.01); *G06F 1/3234* (2013.01); *G06F 1/3296* (2013.01); *H03K 19/0008* (2013.01)

(58) Field of Classification Search
  None
  See application file for complete search history.

(56) References Cited

U.S. PATENT DOCUMENTS

| | | |
|---|---|---|
| 7,412,614 B2 | 8/2008 | Ku et al. |
| 7,461,272 B2 | 12/2008 | Rotem et al. |
| 8,538,598 B2 | 9/2013 | Steinbrecher et al. |
| 2004/0128567 A1 | 7/2004 | Stewart et al. |
| 2005/0088137 A1 | 4/2005 | Cohen et al. |
| 2008/0234953 A1 | 9/2008 | Ignowski et al. |
| 2014/0245032 A1 | 8/2014 | Vadakkanmaruveedu et al. |
| 2015/0001965 A1* | 1/2015 | Angeli .................. G06F 1/206 307/117 |

OTHER PUBLICATIONS

International Search Report and Written Opinion—PCT/US2015/047241—ISA/EPO—Nov. 17, 2015.

* cited by examiner

*Primary Examiner* — Paul Yanchus, III
(74) *Attorney, Agent, or Firm* — Haynes and Boone, LLP

(57) ABSTRACT

A performance setting technique is disclosed for a clocked circuit such as a processor in an integrated circuit. The technique determines a maximum power consumption for the clocked circuit as a function of a total thermal resistance of a mobile device incorporating the integrated circuit. The total thermal resistance is a sum of a system thermal resistance for the mobile device and a device thermal resistance for the integrated circuit.

16 Claims, 4 Drawing Sheets

--- for an integrated circuit including a clocked circuit, determining a maximum power consumption for the clocked circuit response to a total thermal resistance for a system including the integrated circuit and responsive to a thermal limit for the integrated circuit  ~300 determining a performance setting for the clocked circuit that does not exceed the maximum power consumption at the thermal limit  ~305

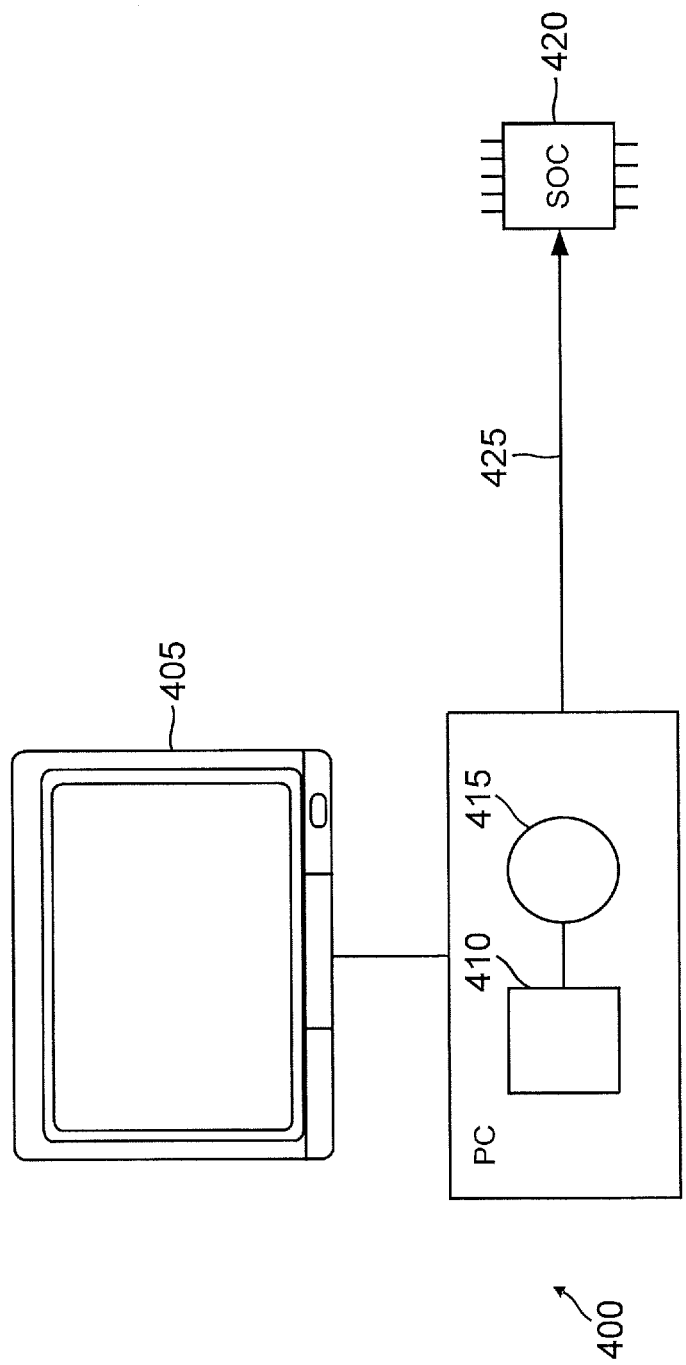

THERMALLY-CONSTRAINED VOLTAGE AND FREQUENCY SCALING

RELATED APPLICATIONS

This application claims the benefit of U.S. Provisional Application No. 62/043,716, filed Aug. 29, 2014, the contents of which are hereby incorporated by reference in their entirety.

TECHNICAL FIELD

This application relates to voltage and frequency scaling, and more particularly to voltage and frequency scaling responsive to thermal constraints.

BACKGROUND

Temperature is critical to microprocessor performance, particularly in mobile applications. In contrast to desktop applications, a mobile device microprocessor such as a system on a chip (SOC) has no fan to assist in cooling but must instead rely on passive cooling. Despite the inability to actively cool through the use of a fan, mobile device processing power continues to mushroom—for example, multiple core architectures are now routine. The resulting heat from the increased processing power may push the SOC to its thermal limit. For example, a common thermal limit for an integrated circuit is 90° C. Should the semiconductor substrate in which the processor is integrated exceed the thermal limit, the processor may be irreversibly damaged.

Although temperature is a thus primary constraint on processor performance, the commonly-used performance parameters such as the Dhrystone million instructions per second (DMIPS) have no readily-characterized temperature dependence. More generally, the performance of intellectual property (IP) blocks is also constrained by temperature with regard to increasing clocking speed and performance. Accordingly, there is a need in the art for improved techniques to characterize an integrated circuit's performance with regard to it thermal limits.

SUMMARY

A performance setting technique for SOCs is provided that exploits the concept of thermal resistance. With regard to thermal resistance, a mobile device such as a cellular telephone may be deemed to comprise a system. That system will include an SOC, which is one of the devices that make up the resulting system. But the thermal resistance of the system is independent of what type of SOC it includes. The SOC may be high performance such that it generates a considerable amount of heat or it may be relatively primitive such that it generates relatively little heat. But the SOC performance is independent of the thermal resistance for the system in which it is incorporated. For example, a mobile device could include an ample copper heat shield that in turn conducts heat to a copper cell phone housing. Such a system design would readily conduct heat from whatever SOC it includes such that the system thermal resistance would be relatively low. On the other hand, the mobile device may have been designed so as to be as compact and inexpensive as possible such that it largely comprises plastic or other insulating materials. The resulting system would then have a relatively high thermal resistance.

In addition to the system thermal resistance, an integrated circuit such as an SOC has its own device thermal resistance. This device thermal resistance depends upon the circuit configuration and also the packaging for the corresponding integrated circuit. From the system thermal resistance and the device thermal resistance, a total thermal resistance may be determined.

The total thermal resistance determines what temperature an SOC will reach as it consumes a given amount of power within the corresponding system. The disclosed performance setting technique exploits the total thermal resistance to determine what amount of power an SOC can consume without exceeding its thermal limit. The performance setting of the SOC is thus rigorously determined by the total thermal resistance. Such a determination is quite advantageous as compared to the ad hoc techniques of the prior art that were employed to determine a maximum performance setting for a given mobile device SOC.

These and other advantageous features may be better appreciated through the following detailed description.

BRIEF DESCRIPTION OF THE DRAWINGS

FIG. 4 is an example system for performing the method of FIG. 3.

DETAILED DESCRIPTION

Figure 1:
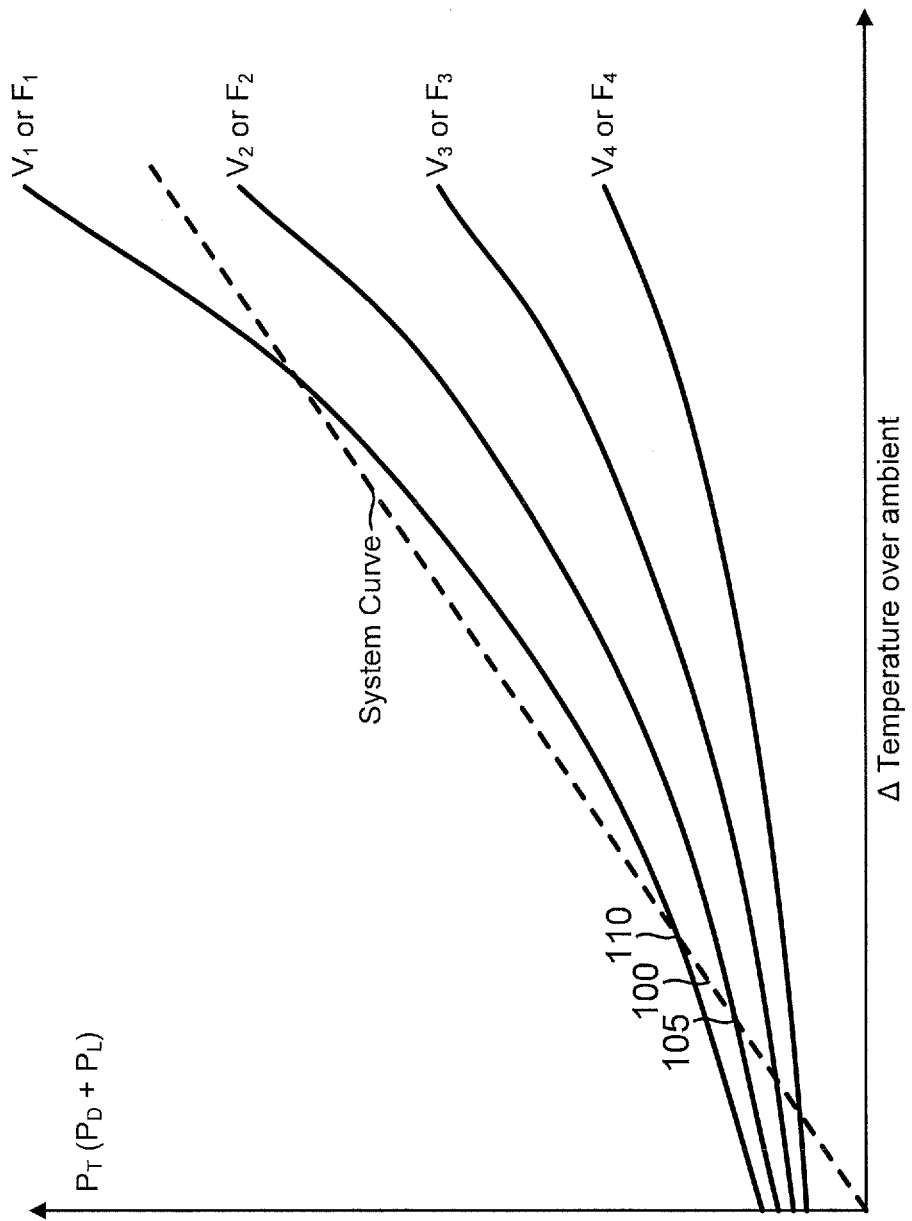
FIG. 1 is a diagram of an example system thermal resistance curve and example device performance curves.

The following systems and techniques exploit the total thermal resistance of a passively-cooled system such as a mobile device to determine the clock frequency and voltage scaling setting for an clocked circuit such as a microprocessor or a graphics processing unit (GPU) in a system-on-a-chip (SOC) within the passively-cooled system. More generally, the clocked circuit comprises an intellectual property block. The resulting technique is remarkably advantageous in that the SOC performance setting may then be directly tied to its thermal limit. For example, suppose the thermal limit is some value such as 90° C. If the SOC produces too much heat from operating at too high a voltage (or equivalently, at too high of a processor clock rate), the thermal limit will be exceeded. Conversely, if the power supply voltage is set too low (or equivalently, if the processor clock rate is set too low), the thermal limit will not be exceeded but processor performance suffers in that the power supply voltage/clock frequency could have been increased without exceeding the thermal limit.

The disclosed technique uses the total thermal resistance to determine the maximum power (e.g, in watts) that may be consumed by an SOC or other type of integrated circuit as determined by the SOC's thermal limit. Given the maximum power that may be consumed, a corresponding performance setting (voltage and/or frequency) for an intellectual property block within the SOC may be determined accordingly. The following discussion will be directed to the determination of the performance setting for a microprocessor, digital signal processor (DSP), or GPU but it will be appreciated that the technique may be broadly applied to other types of intellectual property blocks such a camera IP block. The total thermal resistance is a function of both the system thermal resistance and the device thermal resistance. The system thermal resistance is the thermal resistance of the system incorporating the integrated circuit such as a mobile device. In contrast, the device thermal resistance is the thermal resistance of the integrated circuit itself. The system thermal resistance and the device thermal resistance are both defined with regard to some standard temperature such as ambient (25° C.).

For example, a thermal resistance may be represented by a variable $\theta_j$ equaling $(T_j-T_{amb})$/power, where $T_j$ is the current temperature, $T_{amb}$ is ambient temperature, and power is the power consumed by the SOC. Note that the system thermal resistance depends solely on the mobile device architecture. In other words, the mobile device has some board space which is occupied by the SOC. The thermal resistance with regard to this board space is independent of the SOC characteristics but instead depends upon the thermal conductivities of the various components such as the housing and display that surround the board space that will be occupied by a given SOC as well as the location allotted for the SOC within the mobile device. If the mobile device components are relatively thermally conductive such that heat from the SOC is readily dissipated to the environment, then the system thermal resistance will be relatively low. On the other hand, if the mobile device is constructed from components that are more insulative, heat from the SOC is then not so readily dissipated to the environment. In that case, the system thermal resistance would be relatively high. In addition, if the SOC is located deep within the mobile device, the thermal path length to shed heat from the SOC to the outside environment is longer than if the SOC were located more shallowly within the mobile device. This increased thermal path length increases the system thermal resistance.

The device thermal resistance is similarly dependent upon the thermal properties of the integrated circuit packaging and the circuit density and arrangement within the SOC. As noted above, both the device thermal resistance and the system thermal resistance may be defined as a ratio in which the numerator is the temperature difference between the current SOC temperature and some standard temperature such as ambient. The denominator for the ratio is the power consumed by the SOC such as in watts. An example system thermal resistance may be 15° C. per watt. Similarly, an example device thermal resistance may be 5° C. per watt. The total thermal resistance is the sum of the device and system thermal resistances, which in this example would then be 20° C. per watt. Such a value is a typical total thermal resistance for many SOC/system combinations but it will be appreciated that such resistances are determined on a case-by-case basis depending upon the particular system and SOC designs.

Given the total thermal resistance, the temperature change for the SOC based upon power consumed may then be determined. For example, if the total thermal resistance equals 20° C. per watt and the SOC consumes one watt of power, that SOC will have a temperature of $T_{amb}+20°$ C.=45° C., assuming that the system thermal resistance is defined with regard to $T_{amb}$ as the reference temperature. More generally, if the total thermal resistance is defined with regard to some standard temperature $(T_{std})$ other than ambient, the SOC would have a temperature of $T_{std}+20°$ C. if it consumed 1 W of power in a mobile device having a total thermal resistance of 20° C. per W. The following discussion will assume without loss of generality that the total thermal resistance is defined with regard to the ambient temperature. Similarly, the following discussion will assume that the device is an SOC. However, it will be appreciated that the performance setting technique disclosed herein may be broadly applied to any passively-cooled integrated circuit.

The technique involves exploiting the total thermal resistance to determine the amount of power an SOC may consume before reaching its thermal limit. For example, suppose the thermal limit is 90° C., which as previously mentioned is a typical SOC thermal limit. If the total thermal resistance is 20° C. per W, the SOC may consume (90° C.−25° C.)/(20° C./W)=3.25 W, at which point the SOC will be at its thermal limit. This device temperature will be stable, however, and will not exceed the thermal limit so long as the mobile device environment is at ambient temperature and the SOC consumes no more than 3.25 W.

The technique disclosed herein uses the amount of maximum power that may be consumed by an SOC as determined by the total thermal resistance to determine a suitable performance setting (e.g., the power supply voltage and operating frequency setting) for the SOC. In that regard, voltage and frequency scaling for microprocessors is well known. But the prior art voltage and frequency scaling is typically performed to prolong battery life such that the maximum performance setting (highest power supply voltage and operating frequency setting) has no explicit relationship to the SOC thermal limit. In other words, the prior art typically relied on trial and error to ensure that its maximum performance setting does not exceed the SOC thermal limit. In sharp contrast, the disclosed performance setting technique intelligently selects the voltage and frequency setting such that the maximum amount of performance may be obtained from a given SOC in a given system without exceeding the SOC's thermal limit.

A given SOC may have any number of voltage and frequency settings. In practice, the SOC will be configured to use only a few voltage, frequency pairs from the wide number that could have been implemented. The performance setting technique disclosed herein may use a thermal model of the SOC that determines its temperature as a function of its performance setting. In general, a thermal model that may be used to calculate the temperature of an SOC based upon its performance setting is a function of both the power supply voltage and the operating frequency. However, it can be shown that such functions may be decomposed into one of entirely dependent on voltage or entirely dependent on frequency. In other words, specifying the power supply voltage also determines the operating frequency. Similarly, specifying the operating frequency also determines the power supply voltage level. The following discussion will thus assume that the SOC thermal models may be expressed as a function of the power supply voltage (V) or as a function of the operating frequency (F). Given the power supply voltage V or the operating frequency F, the SOC thermal model determines the total SOC power consumption $(P_T)$ as a function of temperature. The total SOC power consumption $P_T$ may be decomposed into a dynamic power portion $(P_D)$ and a leakage power portion $(P_L)$. The dynamic power portion $P_D$ merely depends upon the current operating mode of the SOC and thus has no appreciable temperature dependence. But the leakage power portion $P_L$ has an exponential dependence on temperature. To make a direct comparison with the total thermal resistance, the leakage power portion $P_L$ may be expressed as a function of the temperature difference from a standard temperature such as ambient such that the leakage power portion $P_T$ is proportional to $P_0(V)e^{\alpha(T-Tambient)}$, where $P_0(V)$ is the base leakage at ambient temperature as a function of V (which equivalently could be a function of F), and α is a proportionality factor for the exponential dependence on the difference between the current temperature T and the ambient temperature.

The resulting total power $P_T$ will thus be an exponentially dependent on the temperature difference from ambient. Due to the leakage power at ambient of $P_0(V)$ and the dynamic power portion $P_D$, the total power $P_T$ will have some non-zero positive value at ambient temperature and rise exponentially from this value as the SOC device temperature increases from the ambient temperature. The total power $P_T$ thus equals $P_D + P_0(V)e^{\alpha(T-Tambient)}$. Depending upon the various levels that may be selected for the power supply voltage V or the operating frequency F, there will thus be a family of exponential total power curves $P_T$ as a function of the difference between the device temperature and the ambient temperature. These power curves, which may also be denoted herein as performance curves, correspond to the various V,F pairs at which the SOC may operate according to its performance thermal model. FIG. 1 illustrates several example exponential total power curves. The greater the power supply voltage V (or equivalently, the greater the operating frequency F), the greater is the resulting exponential total power curve at a given temperature over ambient. For example, a first device curve $V_1$ (or $F_1$) corresponds to a greatest power supply voltage $V_1$ and a corresponding greatest operating frequency $F_1$ as the performance setting for the SOC. Curve $V_1$ would thus correspond to a high-performance frequency and voltage scaling setting for the SOC. A second device curve $V_2$ (or $F_2$) corresponds to a second greatest power supply voltage $V_2$ and a corresponding operating frequency $F_2$ as the performance setting for the SOC. An even lower performance setting is represented by curve $V_3$ (or $F_3$), which corresponds to the temperature vs. power curve for the SOC operating with a reduced power supply voltage $V_3$ and an operating frequency $F_3$. Finally, a lowest performance setting for the SOC is represented by a curve $V_4$ (or $F_4$), which corresponds to the SOC operating with its lowest power supply voltage $V_4$ and corresponding operating frequency $F_4$. Note that some performance settings may share the same power supply voltage but have different operating frequencies. Similarly, other performance settings may share the same operating frequency but have different power supply voltages.

Although the SOC may have a temperature and power dependency at the different performance settings as represented by the curves $V_1$ through $V_4$, the combination of the SOC and its passively-cooled system such as a mobile device has a certain total thermal resistance. As discussed above, a total thermal resistance (θ) is a ratio of a temperature change over power. Since FIG. 1 graphs power on the y Cartesian axis as a function of the temperature difference from ambient on the x Cartesian axis, the resulting system curve shown in FIG. 1 for the passively-cooled system including the SOC is a function of the inverse of the total thermal resistance (1/θ).

Figure 2:
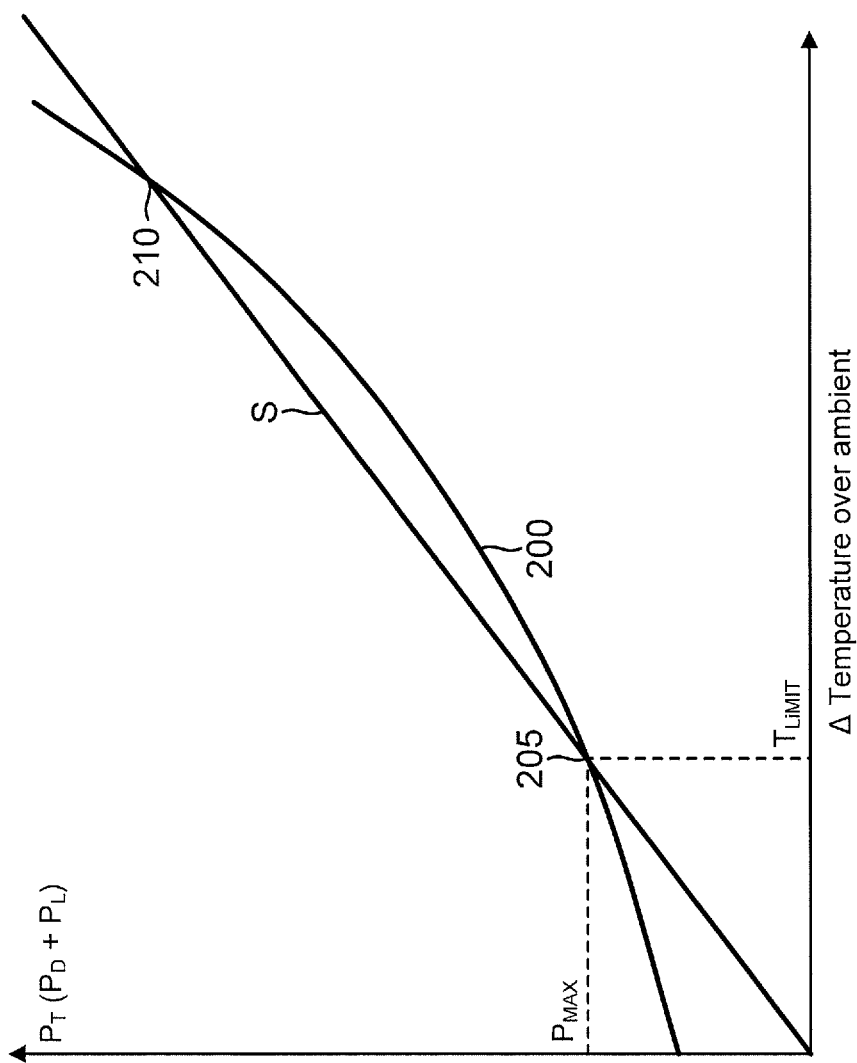
FIG. 2 is a diagram of an example system thermal resistance curve and its intersection with a device performance curve corresponding to a determined performance setting for the device.

The same system curve S is shown in isolation with a single performance curve 200 for illustration clarity in FIG. 2. The SOC thermal limit establishes a temperature difference $T_{LIMIT}$ over ambient. For example, if the SOC thermal limit is 90° C., then $T_{LIMIT}$ is 65° C. above ambient ($T_{LIMIT}$ equals 90° C.−25° C.). As discussed earlier, if the total thermal resistance θ is 20° C./W, then $T_{LIMIT}/θ$ equals 3.25 W, which is the maximum power ($P_{MAX}$) that the SOC can consume. Referring again to FIG. 1, although the performance curves $V_1$ through $V_4$ show the SOC power for a range of various temperature differences over ambient, the SOC temperature is also constrained by the total thermal resistance for the system in which it will be incorporated. Thus, the only points on the performance curves $V_1$ through $V_4$ that represent allowable power vs the temperature difference over ambient combinations are the intersections of the performance curves $V_1$ through $V_4$ with the system curve. Referring again to FIG. 2, there will be a performance curve 200 that intersects with the system curve S at a point 205 corresponding to a temperature difference from ambient of $T_{LIMIT}$ and an SOC power of $P_{MAX}$. In other words, running the SOC at the performance setting of a power supply voltage V (and corresponding operating frequency F) for performance curve 200 results in the maximum performance setting possible for the SOC to operate indefinitely without exceeding its thermal limit. This is remarkably advantageous in that for the first time, an analysis tool is provided that enables an SOC designer to select the determined performance setting given the total thermal resistance of the passively cooled system such as a mobile device that incorporates the SOC.

Note that a performance curve such as curve 200 of FIG. 2 may not only have a first intersection point 205 with the system curve S but also may have a second intersection point 210. In one embodiment, the thermally-constrained performance setting technique disclosed herein considers only the lowest-temperature intersection point such as point 205. Use of the high-temperature operating points such as second intersection point 210 may lead to instabilities.

Not only does this technique provide a fast and efficient way to determine the maximum performance setting for an SOC or other types of integrated circuits whose performance may be characterized at a given power supply voltage and/or operating frequency, the technique may also be used to propose new performance settings. For example, referring back to FIG. 1, suppose that a point 100 on the system curve corresponds to the SOC thermal limit. Performance curve $V_1$ thus corresponds to an unsuitable performance setting as its intersection point 110 with system curve S results in an SOC temperature above the thermal limit. Conversely, performance curve $V_2$ corresponds to a less-than-optimal performance setting as its intersection point 105 with system curve S results in a temperature cooler than the thermal limit such that additional performance for the SOC would be available but not used at such a performance setting. A performance curve (not illustrated) corresponding to a power supply voltage V' may then be generated, where $V_2 < V' < V_1$, that intersects the system curve S at point 100. So long as the resulting intersection for this new performance curve with the system curve S does not correspond to a temperature above the thermal limit, the resulting performance setting would be an improvement as opposed to using the performance setting corresponding to performance curve $V_2$.

Figure 3:
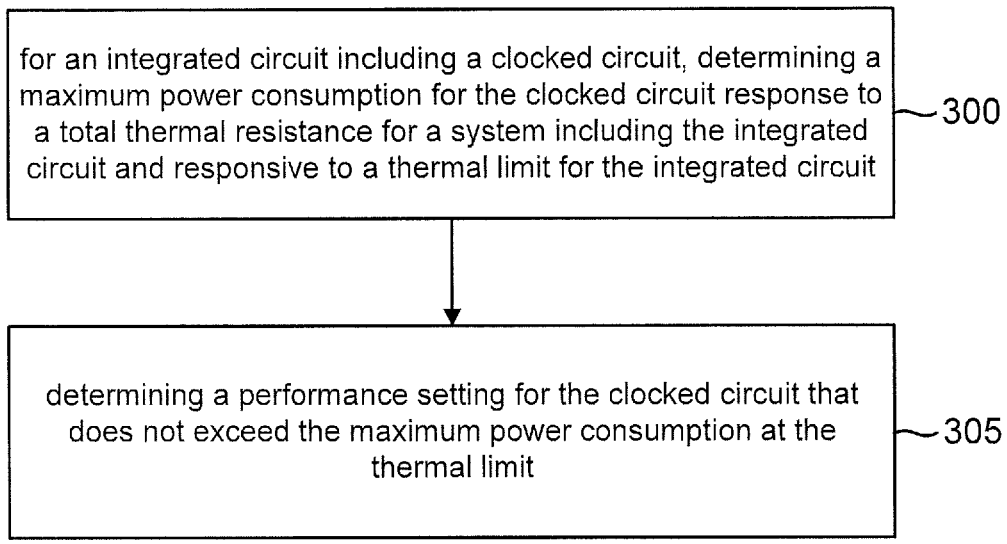
FIG. 3 is a flowchart for a method of determining the performance setting using thermal constraints in accordance with an embodiment of the disclosure.

A flowchart summarizing the thermally-constrained performance setting computer-system-performed technique disclosed herein is shown in FIG. 3. An act 300 comprises determining a maximum power consumption for an intellectual property block in an integrated circuit responsive to a total thermal resistance for a system including the integrated circuit and responsive to a thermal limit for the integrated circuit. The identification of $P_{MAX}$ discussed with regard to FIG. 2 is an example of act 300. The method further comprises an act 305 of determining a performance setting for the intellectual property block that does not exceed the maximum power consumption at the thermal limit. Determining a performance setting corresponding to a performance curve 200 that intersects point 205 discussed with regard to FIG. 2 is an example of act 305.

Many off-the-shelf thermal analysis tools such as Icepak enable a designer to determine the total thermal resistance of a system and its corresponding SOC. The thermal analysis algorithm defined herein proposes a modification of such a tool to also incorporate a family of SOC performance curves such as shown in FIG. 1. For example, a system 400 configured to perform the thermally-constrained performance setting analysis method discussed herein is shown in FIG. 4. System 400 includes a display 405 and a processor 410 for implementing instructions stored on a non-transitory computer readable medium 415. These instructions optimize a performance setting 425 for an SOC 420 as discussed herein. In particular, performance setting 425 is optimized such that the corresponding power consumption does not exceed the thermal limit but remains sufficiently close to the thermal limit such that increasing performance setting 425 would cause SOC 420 to exceed its thermal limit. Processor 410 executes the instructions so as to determine the $P_{MAX}$ as discussed with regard to FIG. 2 for SOC 420 responsive to its thermal limit and the total thermal resistance. As discussed above, processor 410 may determine the total thermal resistance using conventional thermal analysis tools. Alternatively, this analysis may be performed offline and provided to processor 410 such as through the Internet or through a directly-coupled co-processor (not illustrated). Processor 410 would then determine from the family of performance curves, the performance setting 425 that corresponds to SOC 420 consuming $P_{MAX}$ at the thermal limit. SOC 420 may then operate indefinitely at the corresponding voltage and frequency values for performance setting 425 without exceeding its thermal limit within the resulting passively-cooled system.

Examples of non-transitory computer-readable medium 410 include volatile memories such as a dynamic random access memory (DRAM) or a static random access memory (SRAM). Similarly, non-transitory computer-readable medium 410 may comprise a non-volatile memory such as a FLASH or an electrically erasable read-only memory (EEPROM). In addition, non-transitory computer-readable medium 410 may comprise a magnetic disc or an optical disk.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:
1. A method, comprising:
summing a system thermal resistance for a system including an integrated circuit having a clocked circuit and a device thermal resistance for the integrated circuit to determine a total thermal resistance for the system, wherein the system includes a housing surrounding the integrated circuit, and wherein the system thermal resistance depends upon a thermal conductivity of the housing and is independent of the device thermal resistance for the integrated circuit;
determining a maximum power consumption for the clocked circuit responsive to the total thermal resistance for the system;
determining a performance setting for the clocked circuit that does not exceed the maximum power consumption at the thermal limit, wherein the clocked circuit comprises a processor, and wherein the determined performance setting comprises a power supply voltage setting for the processor; and
configuring the processor to operate according to the determined performance setting.

2. The method of claim 1, wherein the determined performance setting further comprises a clock frequency for the processor.

3. The method of claim 1, wherein the total thermal resistance for the system is defined with regard to a location in the system receiving the integrated circuit.

4. The method of claim 3, wherein the total thermal resistance for the system is defined with regard to a circuit board location in the system that receives the integrated circuit as a system on a chip (SOC).

5. The method of claim 1, further comprising:
determining a plurality of performance curves for the processor, each performance curve identifying a power consumption for the processor as a function of a temperature for the processor, each performance curve corresponding to a unique performance setting for the processor; and
identifying from the plurality of performance curves, a selected performance curve that does not exceed the maximum power consumption at the thermal limit, wherein the determined performance setting comprises the performance setting for the selected performance curve.

6. The method of claim 5, wherein each performance setting comprises a unique pair of a power supply voltage setting and clock frequency for the processor.

7. An apparatus, comprising:
a memory for storing instructions; and
a first processor configured to execute the stored instructions, wherein the stored instructions upon execution by the first processor cause the first processor to:
sum a system thermal resistance for a mobile device including an integrated circuit having a second processor and a device thermal resistance for the integrated circuit to determine a total thermal resistance for the mobile device, wherein the mobile device includes a housing surrounding the integrated circuit, and wherein the system thermal resistance depends upon a thermal conductivity of the housing and is independent of the device thermal resistance for the integrated circuit;
determine a maximum power consumption for the second processor responsive to the total thermal resistance;
determine a performance setting for the second processor that does not exceed the maximum power consumption at the thermal limit, wherein the determined performance setting comprises a power supply voltage setting for the second processor; and
configure the second processor to operate according to the determined performance setting.

8. The apparatus of claim 7, wherein the second processor comprises a system on a chip (SOC).

9. The apparatus of claim 8, wherein the determined performance setting further comprises a clock frequency for the SOC.

10. The apparatus of claim 8, wherein the total thermal resistance of the mobile device is defined with regard to a space on a circuit board that receives the SOC and with regard to a device thermal resistance for the SOC.

11. The apparatus of claim 10, wherein the mobile device comprises a cellular telephone.

12. A non-transitory computer readable medium having computer-readable instructions stored thereon, wherein the computer-readable instructions when executed by a processor cause the processor to:
sum a system thermal resistance for a mobile device including an integrated circuit having a microprocessor and a device thermal resistance for the integrated circuit to determine a total thermal resistance for the mobile device, wherein the mobile device includes a housing surrounding the integrated circuit, and wherein the system thermal resistance depends upon a thermal conductivity of the housing and is independent of the device thermal resistance for the integrated circuit;
determine a maximum power consumption for the microprocessor responsive to a the total thermal resistance;
determine a performance setting for the microprocessor that does not exceed the maximum power consumption at the thermal limit, wherein the determined performance setting comprises a power supply voltage setting for the microprocessor; and
configure the microprocessor to operate according to the determined performance setting.

13. The non-transitory computer readable medium of claim 12, wherein the determined performance setting further comprises a clock frequency for the microprocessor.

14. The non-transitory computer readable medium of claim 12, wherein the total thermal resistance for the mobile device is defined with regard to a location in the mobile device receiving the integrated circuit.

15. The non-transitory computer readable medium of claim 12, wherein the total thermal resistance for the mobile device is defined with regard to a circuit board location in the mobile device that receives the integrated circuit as a system on a chip (SOC).

16. The non-transitory computer readable medium of claim 13, wherein the computer-readable instructions when executed by the processor further cause the processor to:
determine a plurality of performance curves for the microprocessor, each performance curve identifying a power consumption for the microprocessor as a function of a temperature for the microprocessor, each performance curve corresponding to a unique performance setting for the microprocessor; and
identify from the plurality of performance curves, a selected performance curve that satisfies the maximum power consumption at the thermal limit, wherein the determined performance setting for the microprocessor comprises the performance setting for the selected performance curve.

* * * * *